(12) United States Patent
Liu et al.

(10) Patent No.: US 12,433,045 B2
(45) Date of Patent: Sep. 30, 2025

(54) SENSING DEVICE, METHOD OF MANUFACTURING SENSING DEVICE AND ELECTRONIC DEVICE

(71) Applicant: InnoLux Corporation, Miao-Li County (TW)

(72) Inventors: Yu-Tsung Liu, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 517 days.

(21) Appl. No.: 17/840,096

(22) Filed: Jun. 14, 2022

(65) Prior Publication Data

US 2023/0035724 A1 Feb. 2, 2023

(30) Foreign Application Priority Data

Jul. 30, 2021 (CN) .......................... 202110870843.7

(51) Int. Cl.
*H10F 39/12* (2025.01)
*G06F 3/042* (2006.01)
*G06V 40/13* (2022.01)
*H10F 39/00* (2025.01)

(52) U.S. Cl.
CPC ......... *H10F 39/198* (2025.01); *H10F 39/024* (2025.01); *H10F 39/8057* (2025.01); *H10F 39/8063* (2025.01); *G06F 3/0421* (2013.01); *G06V 40/1318* (2022.01)

(58) Field of Classification Search
CPC .. H10F 39/198; H10F 39/024; H10F 39/8057; H10F 39/8063; G06F 3/0421; G06F 3/042; G06V 40/1318
See application file for complete search history.

(56) References Cited

U.S. PATENT DOCUMENTS

| | | | |
|---|---|---|---|
| 2019/0296055 A1* | 9/2019 | Lius | H10D 86/441 |
| 2020/0111815 A1* | 4/2020 | Lius | G09G 3/3225 |
| 2020/0200925 A1 | 6/2020 | Jeon et al. | |
| 2020/0219455 A1* | 7/2020 | Lius | G02F 1/133514 |
| 2020/0265207 A1* | 8/2020 | Chu | G06F 21/32 |
| 2021/0020810 A1* | 1/2021 | Lius | G06F 21/32 |
| 2021/0216743 A1* | 7/2021 | Liu | G06V 40/1318 |

* cited by examiner

*Primary Examiner* — Fernando L Toledo
*Assistant Examiner* — Ryan T. Fortin
(74) *Attorney, Agent, or Firm* — McClure, Qualey & Rodack, LLP

(57) ABSTRACT

A method of manufacturing a sensing device includes: providing a substrate; forming a circuit element on the substrate; forming a sensing element on the substrate; forming a planarization layer on the sensing element and the circuit element; forming a first opening in the planarization layer, wherein the first opening overlaps with the circuit element; and forming a second opening in the planarization layer, wherein the second opening overlaps with the sensing element. In addition, the first opening and the second opening are formed by different processes.

19 Claims, 13 Drawing Sheets

SENSING DEVICE, METHOD OF MANUFACTURING SENSING DEVICE AND ELECTRONIC DEVICE

CROSS REFERENCE TO RELATED APPLICATIONS

This application claims the benefit of China Application No. 202110870843.7, filed Jul. 30, 2021, the entirety of which is incorporated by reference herein.

BACKGROUND

Technical Field

The present disclosure is related to a sensing device, and in particular it is related to a method of manufacturing a sensing device with improved sensitivity.

Description of the Related Art

Optical sensing devices are widely used in consumer electronics such as smartphones and wearable devices etc., and have become indispensable necessities in modern society. With the flourishing development of such consumer electronics, consumers have high expectations regarding the quality, functionality, or price of these products.

The sensing element in an optical sensing device converts received light into an electrical signal, which can be transmitted to the driving element and logic circuit in the optical sensing device for processing and analysis. Generally, the sensitivity of the sensing element is affected by quantum efficiency and photoelectric conversion efficiency, and the photoelectric conversion efficiency is mainly affected by the equivalent capacitance of the sensing element.

In order to improve the performance of the sensing device, researchers in the current industry are seeking to develop a method of manufacturing a sensing device that can further improve the sensitivity of the sensing device (e.g., a process of miniaturizing the sensing device to reduce the equivalent capacitance thereof).

SUMMARY

In accordance with some embodiments of the present disclosure, a method of manufacturing a sensing device is provided. The method includes: providing a substrate; forming a circuit element on the substrate; forming a sensing element on the substrate; forming a planarization layer on the sensing element and the circuit element; forming a first opening in the planarization layer, wherein the first opening overlaps with the circuit element; and forming a second opening in the planarization layer, wherein the second opening overlaps with the sensing element. In addition, the first opening and the second opening are formed by different processes.

In accordance with some embodiments of the present disclosure, a sensing device is provided. The sensing device includes a substrate, a circuit element, a sensing element, and a planarization layer. The circuit element is disposed on the substrate. The sensing element is disposed on the substrate. The planarization layer is disposed on the sensing element and the circuit element. The planarization layer includes a first opening and a second opening. The first opening overlaps with the circuit element, and the second opening overlaps with the sensing element. In addition, a sidewall of the first opening has a first angle with respect to a plane of the substrate, a sidewall of the second opening has a second angle with respect to the plane of the substrate, and the first angle is smaller than the second angle.

In accordance with some embodiments of the present disclosure, an electronic device is provided. The electronic device includes a display device and the aforementioned sensing device. The sensing device is disposed below the display device.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
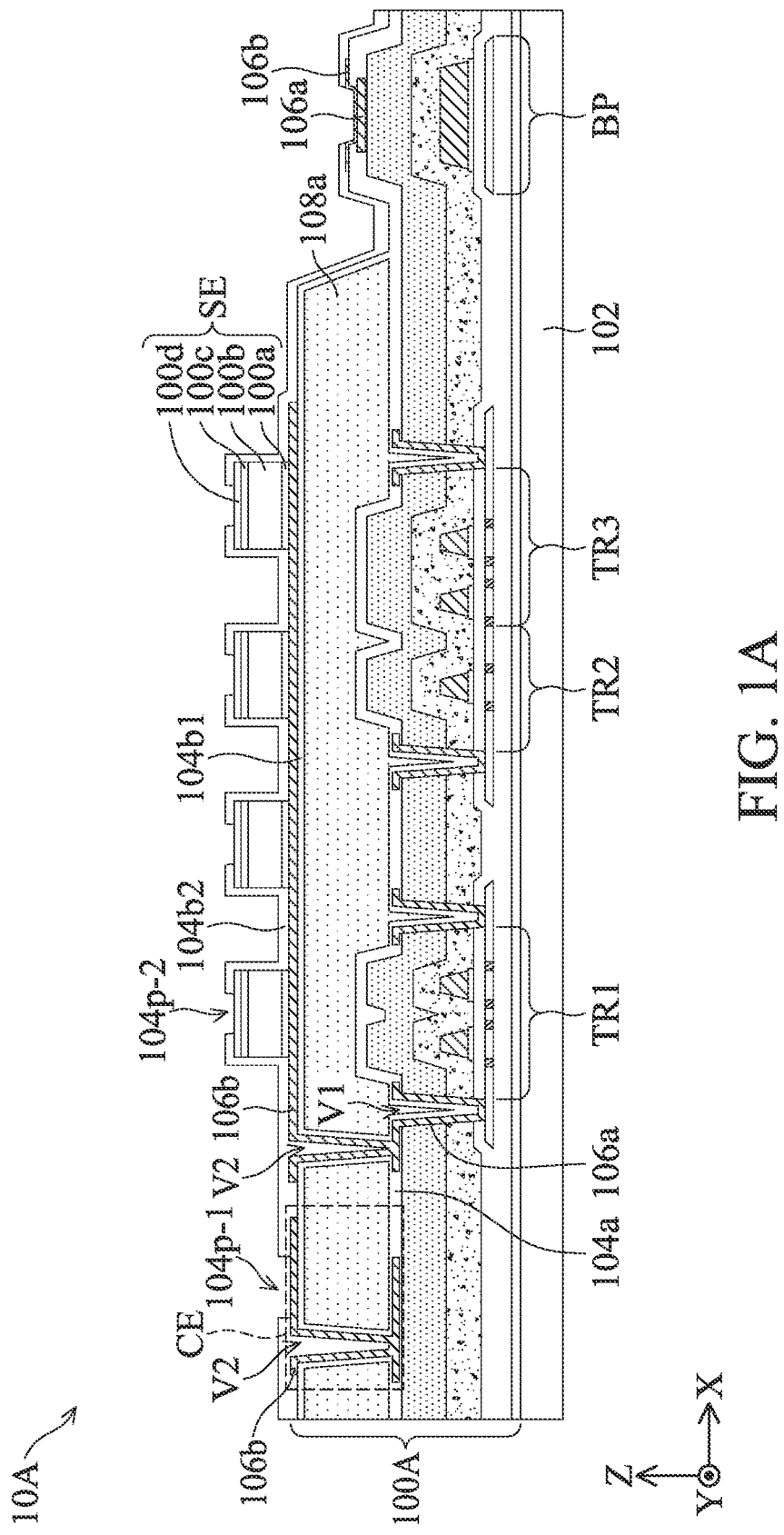
FIGS. 1A to 1E are cross-sectional diagrams of a sensing device during different process stages in accordance with some embodiments of the present disclosure.

A method of manufacturing a sensing device, the sensing device and an electronic device according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first element/layer is disposed on a second element/layer" or "a first element/layer is connected to a second element/layer", may indicate that the first element/layer is in direct contact with the second element/layer, or it may indicate that the first element/layer is in indirect contact with the second element/layer. In the situation where the first element/layer is in indirect contact with the second element/layer, there may be one or more intermediate layers between the first element/layer and the second element/layer. However, the expression "the first element/layer is directly disposed on the second element/layer" or "the first element/layer is directly connected to the second element/layer" means that the first element/layer is in direct contact with the second element/layer, and there is no intermediate element or layer between the first element/layer and the second element/layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean+/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. When there is no specific description, the stated value includes the meaning of "about" or "substantially". The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict with the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the ordinary skills of the present disclosure and the background or the context of the present disclosure, and should not be interpreted in an idealized or overly formal manner unless so defined.

The planarization layer materials are widely used in semiconductor and panel manufacturing processes, and can be classified into non-photosensitive and photosensitive according to material properties. The non-photosensitive planarization layer material needs to be patterned through an etching process, which can achieve smaller openings; however, the thickness of the planarization layer cannot be too thick in this case. Therefore, the flatness and the stray capacitance performance may be poor. The photosensitive planarization layer material can be patterned through exposure and development processes. Therefore, the thickness of the planarization layer can be thicker, and the stray capacitance can be reduced. However, in this case, the ability of forming small-sized openings is poor, and the application on high-resolution products is limited.

In accordance with the embodiments of the present disclosure, a method of manufacturing a sensing device includes using different patterning processes to form openings at specific positions of the planarization layer, which can comprehensively improve the flatness, thickness, and resolution of the openings of the planarization layer. Therefore, the size of the sensing element can be miniaturized and the generation of stray capacitance can be reduced. Accordingly, the equivalent capacitance of the sensing element can be reduced, the sensitivity of the sensing element can be improved or the overall performance of the sensing device can be improved.

Refer to FIGS. 1A to 1E, which are cross-sectional diagrams of a sensing device 10A during different process stages in accordance with some embodiments of the present disclosure. It should be understood that, in accordance with some embodiments, additional steps may be added before, during, and/or after the method of manufacturing the sensing device 10A is performed. In accordance with some embodiments, some of the steps described below may be replaced or omitted. In accordance with some embodiments, the order of some of the steps described below may be interchangeable.

First, referring to FIG. 1A, a substrate 102 is provided. In accordance with some embodiments, a structural layer 100A may be formed on the substrate 102. In accordance with some embodiments, before forming the structure layer 100A, a buffer layer (not illustrated) may be formed on the substrate 102, and then the structure layer 100A may be formed on the buffer layer. In accordance with some embodiments, the structure layer 100A may include thin-film transistors, for example, a thin-film transistor TR1, a thin-film transistor TR2, and a thin-film transistor TR3 shown in the drawings. In addition, the structure layer 100A may include conductive elements and signal lines that are electrically connected to the thin-film transistors, insulating layers formed between the conductive elements, and planarization layers, etc. In accordance with some embodiments, the signal line may include, for example, a current signal line, a voltage signal line, a high-frequency signal line, and a low-frequency signal line, and the signal line can transmit device operating voltage (VDD), common ground voltage (VSS), or the voltage of driving device terminal, but the present disclosure is not limited thereto.

In accordance with some embodiments, the thin-film transistors may include switching transistors, drive transistors, reset transistors, transistor amplifiers, or other suitable thin-film transistors. Specifically, in accordance with some embodiments, the thin-film transistor TR1 may be a reset transistor, the thin-film transistor TR2 may be a transistor amplifier or a source follower, the thin-film transistor TR3 may be a switching transistor, but they are not limited thereto.

It should be understood that the number of the thin-film transistors is not limited to that shown in the figures, and the sensing device 10A may have other suitable numbers or types of thin-film transistors according to different embodiments. Moreover, the type of the thin-film transistor may include a top gate thin-film transistor, a bottom gate thin-film transistor, a dual gate (or double gate) thin-film transistor, or a combination thereof. In accordance with some embodiments, the thin-film transistors may be further electrically connected with a capacitor element, but it is not limited thereto. Furthermore, the thin-film transistor may include at least one semiconductor layer, a gate dielectric layer, and a gate electrode layer. In accordance with some embodiments, the material of the semiconductor layer may include amorphous silicon, polysilicon, or metal oxide. In addition, different thin-film transistors may contain different semiconductor materials. For example, the materials of the semiconductor layers of the thin-film transistor TR1 or the thin-film transistor TR3 may be metal oxide, and the material of the semiconductor layer of the thin-film transistor TR2 may be polysilicon. In accordance with some embodiments, the materials of the semiconductor layers of the thin-film transistor TR1, the thin-film transistor TR2 and the thin-film transistor TR3 are all polysilicon. The thin-film transistors may exist in various forms known to those skilled in the art, and the detailed structure of the thin-film transistors will not be repeated here.

Moreover, as shown in FIG. 1A, in accordance with some embodiments, the structure layer 100A may include a bonding structure BP, and the bonding structure BP may serve as an outer lead bonding area (OLB) of the sensing device 10A. Specifically, the bonding structure BP may include portions of a conductive layer 106a and a conductive layer 106b. In accordance with some embodiments, a chip on film (COF) may be electrically connected to the bonding structure BP through a conductive adhesive.

In accordance with some embodiments, the substrate 102 may include a flexible substrate, a rigid substrate, or a combination thereof, but it is not limited thereto. In accordance with some embodiments, the material of the substrate 102 may include glass, quartz, sapphire, ceramic, polyimide (PI), polycarbonate (PC), polyethylene terephthalate (PET), polypropylene (PP), another suitable material, or a combination thereof, but it is not limited thereto. Moreover, in accordance with some embodiments, the substrate 102 may include a metal-glass fiber composite plate, or a metal-ceramic composite plate, but it is not limited thereto. In addition, the light transmittance of the substrate 102 is not limited. That is, the substrate 102 may be a transparent substrate, a semi-transparent substrate or a non-transparent substrate.

Next, the circuit element CE may be formed on the substrate 102. In accordance with some embodiments, the circuit element CE may be used to provide a common voltage signal. For example, the circuit element CE may be electrically connected to the system voltage line or electrically connected to the bonding structure BP. As shown in FIG. 1A, the circuit element CE may be a metal stack structure, and may include a plurality of metal layers, for example, portions of the conductive layer 106a and the conductive layer 106b.

Specifically, portions of the gate dielectric layer and the dielectric layer in the structure layer 100A may be removed by a patterning process to form a through-hole V1, and then the conductive layer 106a may be formed in the through-hole V1, and then the a passivation layer 104a may be formed on the conductive layer 106a. Next, a planarization layer 108a may be formed on the passivation layer 104a, and the planarization layer 108a may cover the aforementioned conductive layer 106a and the passivation layer 104a. Moreover, a portion of the planarization layer 108a may be removed by a patterning process, so that the planarization layer 108a covers the thin-film transistor TR1, the thin-film transistor TR2 and the thin-film transistor TR3, but does not cover the bonding structure BP. Next, a portion of the planarization layer 108a may be removed by a patterning process to form a through-hole V2, and then a passivation layer 104b1 may be formed on the planarization layer 108a and in the through-hole V2, and then the conductive layer 106b may be formed on the passivation layer 104b1 and in the through-hole V2.

As shown in FIG. 1A, a portion of the conductive layer 106b may penetrate through the planarization layer 108a and the passivation layer 104b1 to be electrically connected to the conductive layer 106a, and the conductive layer 106a may penetrate through the gate dielectric layer (not illustrated) and the dielectric layer (not illustrated) to be electrically connected to the semiconductor layer of the thin-film transistor TR1. In addition, another portion of the conductive layer 106b may be used as a site for the bonding structure BP to bond with other structures, but it is not limited thereto.

In accordance with some embodiments, the passivation layer 104a and the passivation layer 104b1 may have a single-layer or multi-layer structure, and the materials of the passivation layer 104a and the passivation layer 104b1 may include inorganic materials, organic materials, or a combination thereof, but they are not limited thereto. For example, the inorganic material may include, but is not limited to, silicon nitride, silicon oxide, silicon oxynitride, other suitable materials, or a combination thereof. For example, the organic material may include, but is not limited to, polyethylene terephthalate (PET), polyethylene (PE), polyethersulfone (PES), polycarbonate (PC), polymethylmethacrylate (PMMA), polyimide (PI), other suitable materials, or a combination thereof.

In accordance with some embodiments, the passivation layer 104a and the passivation layer 104b1 may be formed by a coating process, a chemical vapor deposition process, a physical vapor deposition process, a printing process, an evaporation process, a sputtering process, other suitable processes, or a combination thereof. For example, the chemical vapor deposition process may include low pressure chemical vapor deposition (LPCVD), low temperature chemical vapor deposition (LTCVD), rapid thermal chemical vapor deposition (RTCVD), and plasma enhanced chemical vapor deposition (PECVD) or atomic layer deposition (ALD), etc., but it is not limited thereto. For example, the physical vapor deposition process may include a sputtering process, an evaporation process, a pulsed laser deposition, etc., but it is not limited thereto.

In accordance with some embodiments, the conductive layer 106a and the conductive layer 106b may include conductive materials, such as metal materials, transparent conductive materials, other suitable conductive materials, or a combination thereof, but they are not limited thereto. The metal material may include, for example, copper (Cu), silver (Ag), gold (Au), tin (Sn), aluminum (Al), molybdenum (Mo), tungsten (W), chromium (Cr), nickel (Ni), platinum (Pt), titanium (Ti), alloys of the foregoing metals, other suitable materials, or a combination thereof, but it is not limited thereto. The transparent conductive material may include transparent conductive oxide (TCO); for example, it may include indium tin oxide (ITO), antimony zinc oxide (AZO), tin oxide (SnO), zinc oxide (ZnO), indium zinc oxide (indium zinc oxide, IZO), indium gallium zinc oxide (IGZO), indium tin zinc oxide (ITZO), antimony tin oxide (ATO), other suitable transparent conductive materials, or a combination thereof, but it is not limited thereto.

In accordance with some embodiments, the conductive layer 106a and the conductive layer 106b may be formed by a chemical vapor deposition process, a physical vapor deposition process, an electroplating process, an electroless plating process, other suitable processes, or a combination thereof.

In accordance with some embodiments, the material of the planarization layer 108a may include an organic material, an inorganic material, other suitable materials, or a combination thereof, but it is not limited thereto. For example, the inorganic material may include, but is not limited to, silicon nitride, silicon oxide, silicon oxynitride, aluminum oxide, other suitable materials, or a combination thereof. For example, the organic material may include, but is not limited to, epoxy resins, silicone resins, acrylic resins (e.g., polymethylmethacrylate (PMMA)), polyimide, perfluoroalkoxy alkane (PFA), other suitable materials or a combination thereof.

In accordance with some embodiments, the planarization layer 108a may be formed by a chemical vapor deposition process, a physical vapor deposition process, a coating process, a printing process, other suitable processes, or a combination thereof.

Furthermore, a portion of the gate dielectric layer, a portion of the dielectric layer, and a portion of the planarization layer 108a in the structural layer 100A may be removed by one or more photolithography processes and/or etching processes, to form the through-hole V1 and the through-hole V2. In accordance with some embodiments, the photolithography process may include photoresist coating (e.g., spin coating), soft baking, hard baking, mask alignment, exposure, post-exposure baking, photoresist development, washing and drying, etc., but it is not limited thereto. The etching process may include a dry etching process or a wet etching process, but it is not limited thereto.

Next, a sensing element SE may be formed on the substrate 102. Specifically, after the passivation layer 104b1 and the conductive layer 106b are formed on the planarization layer 108a, the sensing element SE may be formed on the conductive layer 106b, and the sensing element SE may be electrically connected to the thin-film transistor TR1, the thin-film transistor TR2 and the thin-film transistor TR3 through the conductive layer 106b and conductive layer 106a. The sensing element SE can receive light and convert it into an electrical signal, and the generated electrical signal can be transmitted to the structure layer 100A and processed and analyzed by the sensing circuit in the structure layer 100A. In accordance with some embodiments, the sensing element SE may include a photodiode, other elements capable of converting optical and electrical signals, other elements capable of sensing capacitance, other elements capable of sensing electromagnetic signals, other elements capable of sensing sound waves, or a combination thereof, but it is not limited thereto.

In accordance with some embodiments, the sensing element SE may have a first doped layer 100a, an intrinsic layer 100b, a second doped layer 100c and a conductive layer 100d. The intrinsic layer 100b may be disposed between the first doped layer 100a and the second doped layer 100c. The conductive layer 100d may be disposed above the second doped layer 100c and may serve as an electrode of the sensing element SE. In accordance with some embodiments, the aforementioned conductive layer 106b may serve as a pixel electrode of the sensing element SE. In addition, in accordance with some embodiments, the sensing element SE may have a P-I-N structure, an N-I-P structure or other suitable structures. When light illuminates the sensing element SE, electron-hole pairs may be generated to form a photocurrent, but it is not limited thereto. In accordance with some embodiments, the first doped layer 100a may be, for example, an N-type doped region, and the second doped layer 100c may be, for example, a P-type doped region, and the first doped layer 100a and the second doped layer 100c are combined with the intrinsic layer 100b to form an N-I-P structure.

In accordance with some embodiments, the first doped layer 100a, the intrinsic layer 100b, the second doped layer 100c, and the conductive layer 100d may be sequentially formed on the conductive layer 106b. Next, portions of the first doped layer 100a, the intrinsic layer 100b, the second doped layer 100c and the conductive layer 100d may be removed by one or more photolithography processes and/or etching processes to form a plurality of sensing elements SE.

In accordance with some embodiments, the materials of the first doped layer 100a, the intrinsic layer 100b, and the second doped layer 100c may include semiconductor materials, such as silicon or other suitable materials. In accordance with some embodiments, the first doped layer 100a, the intrinsic layer 100b and the second doped layer 100c may be formed by an epitaxial growth process, an ion implantation process, a chemical vapor deposition process, a physical vapor deposition process, other suitable processes, or a combination thereof.

In accordance with some embodiments, the material of the conductive layer 100d may be the same as or similar to the material of the aforementioned conductive layer 106a or the conductive layer 106b, and the method of forming the conductive layer 100d may be the same as or similar to the process of forming the aforementioned conductive layer 106a or the conductive layer 106b, and thus will not be repeated here.

After the sensing elements SE are formed on the planarization layer 108a, a passivation layer 104b2 may be formed on the sensing elements SE and the circuit element CE, and the passivation layer 104b2 may be patterned to expose the circuit element CE and the sensing elements SE. Specifically, the passivation layer 104b2 may be conformally formed on the sensing elements SE, the conductive layer 106b and the circuit element CE. Next, a portion of the passivation layer 104b2 located above the conductive layer 106b of the circuit element CE and a portion of the passivation layer 104b2 located above the conductive layer 100d may be removed by one or more photolithography processes and/or etching processes, so that an opening 104p-1 and an opening 104p-2 may be formed, respectively. As shown in FIG. 1A, the opening 104p-1 may expose a portion of the conductive layer 106b, and the opening 104p-2 may expose a portion of the conductive layer 100d. Moreover, a portion of the passivation layer 104b2 located above the bonding structure BP may also be removed by one or more photolithography processes and/or etching processes to expose the bonding site.

Figure 1B:
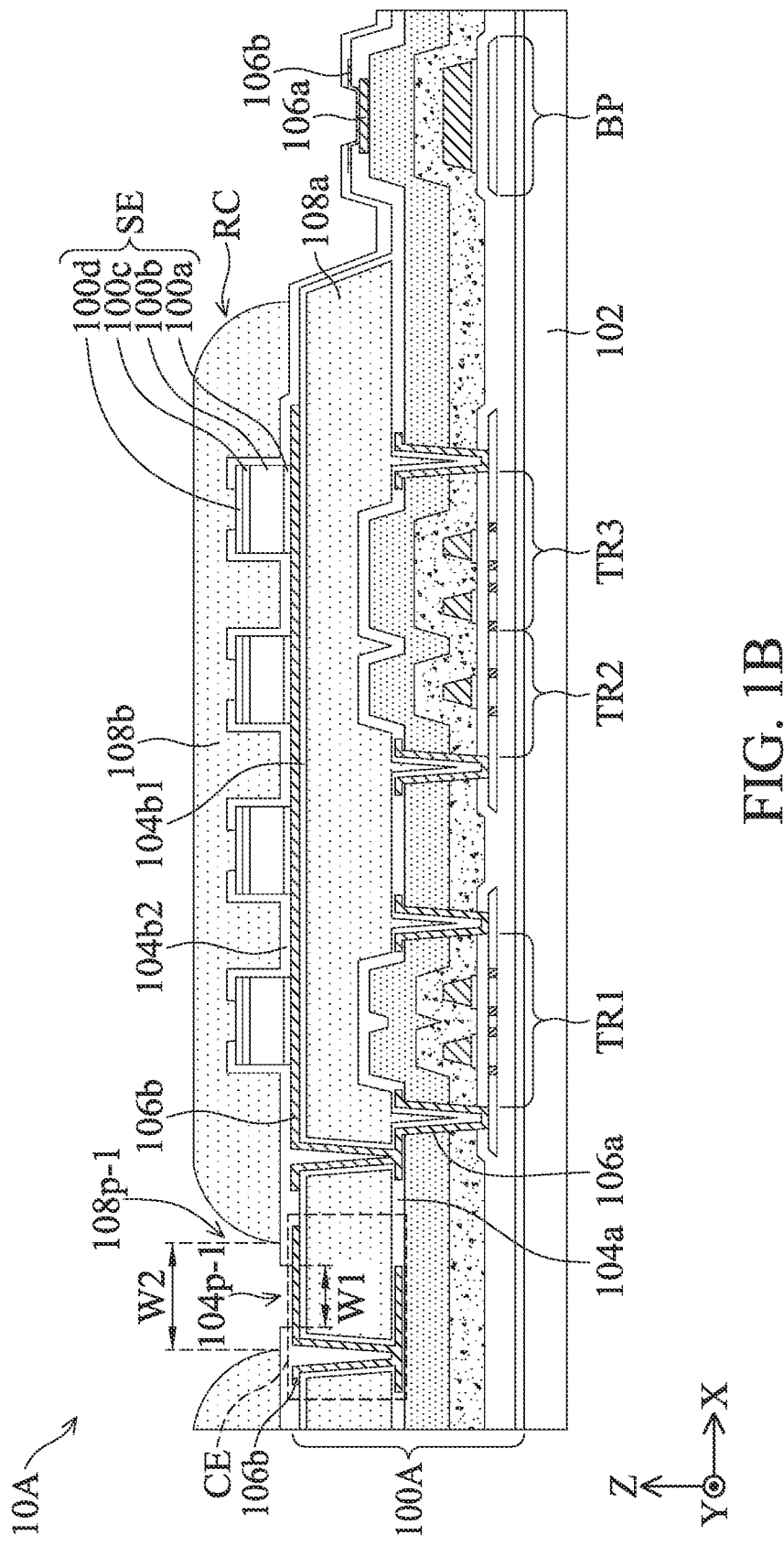

Next, referring to FIG. 1B, a planarization layer 108b may be formed on the sensing elements SE and the circuit element CE, and an opening 108p-1 may be formed in the planarization layer 108b to expose the circuit element CE. In this embodiment, the step of patterning the passivation layer 104b2 is performed before the step of forming the planarization layer 108b. Specifically, the planarization layer 108b may cover the sensing elements SE, the circuit element CE and the bonding structure BP, and may also be filled between the sensing elements SE and in the opening 104p-1 and opening 104p-2, and then the portion of the planarization layer 108b located above the circuit element CE may be removed to form the opening 108p-1, and the portion of the planarization layer 108b located above the bonding structure BP may be removed.

As shown in FIG. 1B, the opening 108p-1 may overlap the opening 104p-1 formed in the previous step. In other words, the planarization layer 108b may have a stepped opening located above the circuit element CE. In accordance with some embodiments, a width W1 of the opening 104p-1 may be smaller than a width W2 of the opening 108p-1. Moreover, in accordance with some embodiments, after removing the portion of the planarization layer 108b, the planarization layer 108b may have a curved profile. For example, the planarization layer 108b may have an arc-shaped top angle RC. It should be understood that the term "overlap" refers to "overlap in a normal direction of the substrate 102 (e.g., the Z direction in the drawing)" in accordance with the embodiments of the present disclosure.

In addition, it should be understood that, in accordance with the embodiments of the present disclosure, the width of the opening refers to the maximum width of the bottom surface of the opening on a plane that is perpendicular to the normal direction of the substrate 102 (e.g., the X-Y plane in the drawings).

In accordance with some embodiments, the material of the planarization layer 108b may be the same as or similar to the material of the aforementioned planarization layer 108a, and the method of forming the planarization layer 108b may be the same as or similar to the process of forming the aforementioned planarization layer 108a, and thus will not be repeated here.

It should be noted that since the material of the planarization layer 108b itself has photosensitivity, a portion of the planarization layer 108b may be removed by the exposure and development processes in the photolithography process. That is, the opening 108p-1 may be formed by the exposure and development processes in the photolithography process.

Figure 1C:
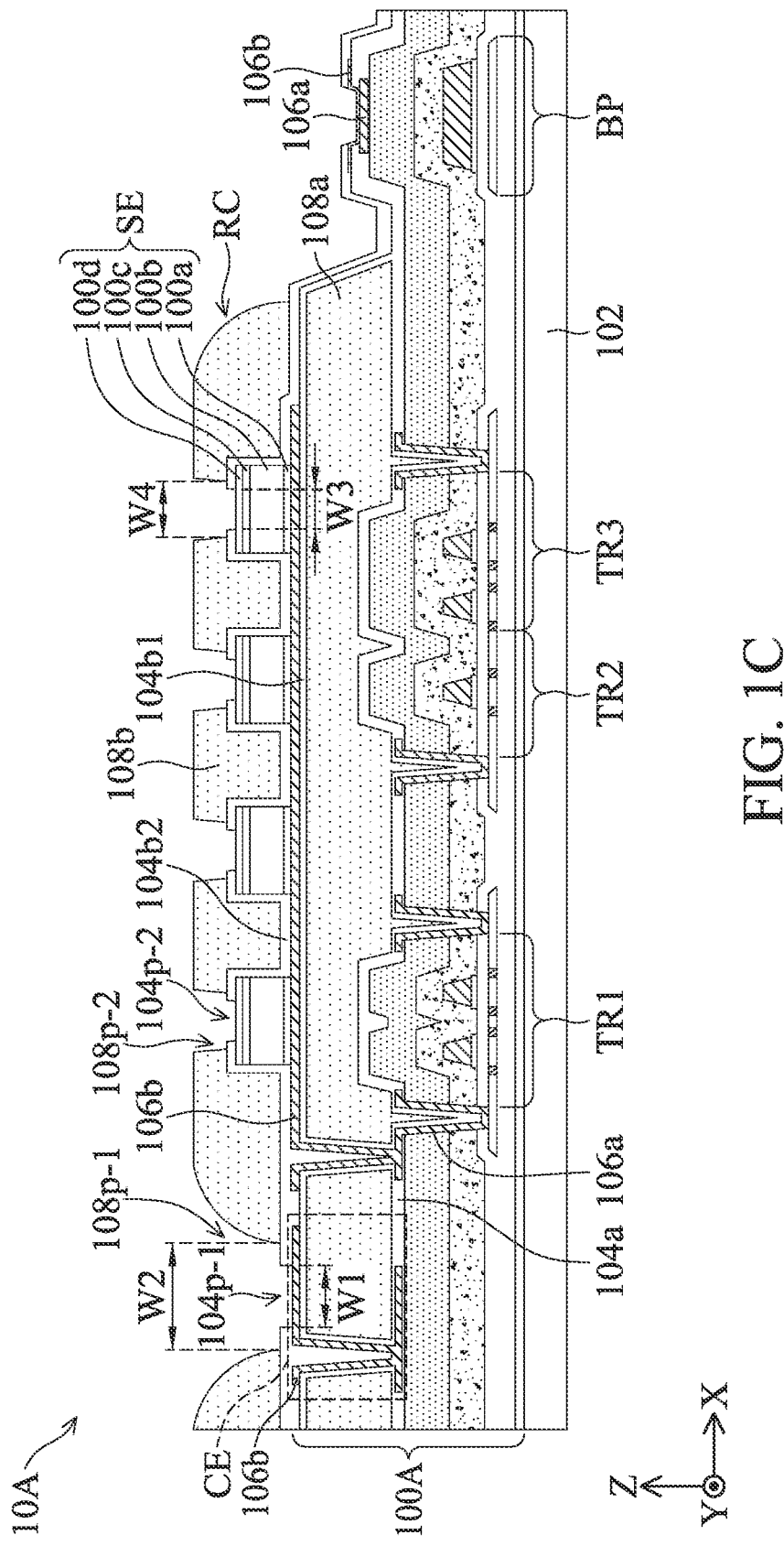

Next, referring to FIG. 1C, an opening 108p-2 may be formed in the planarization layer 108b to expose the sensing element SE. Specifically, a portion of the planarization layer 108b located above the sensing element SE may be removed by an etching process to expose a portion of the top surface of the conductive layer 100d and portions of the side surface and top surface of the passivation layer 104b2.

As shown in FIG. 1C, the opening 108p-2 may overlap the opening 104p-2 formed in the previous step (as shown in FIG. 1B). In other words, the planarization layer 108b may have a stepped opening located above the sensing element SE. In accordance with some embodiments, a width W3 of the opening 104p-2 may be smaller than a width W4 of the opening 108p-2. In accordance with some embodiments, the width W2 of the opening 108p-1 may be greater than the width W4 of the opening 108p-2.

It should be noted that the opening 108p-1 and the opening 108p-2 are formed by different processes. The opening 108p-1 is formed by exposure and development processes, while the opening 108p-2 is formed by an etching process. Since the opening 108p-1 is formed by exposure and development processes, the thickness and flatness of the planarization layer 108b near the opening 108p-1 can be maintained, thereby reducing the generation of stray capacitance. In addition, since the opening 108p-2 is formed by an etching process, a small-sized opening can be achieved, thereby realizing the miniaturization of the sensing element SE and reducing the equivalent capacitance of the sensing element SE.

Figure 1D:
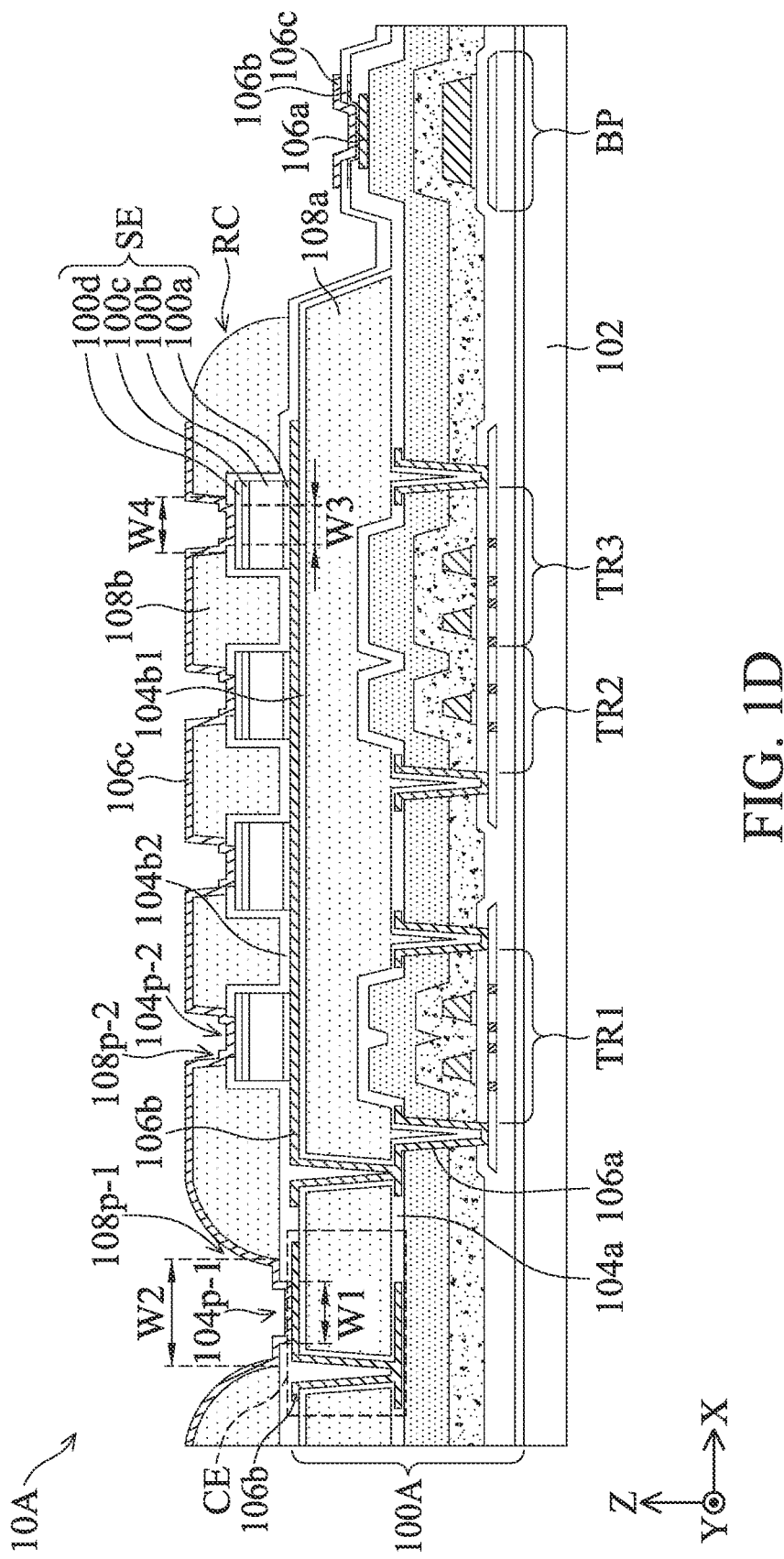

Next, referring to FIG. 1D, a conductive layer 106c may be formed on the planarization layer 108b and cover the opening 108p-1 and openings 108p-2, and the conductive layer 106c may be electrically connected to the circuit element CE and the sensing element SE through the opening 108p-1 and opening 108p-2, respectively. In accordance with some embodiments, the conductive layer 106c may be electrically connected to the sensing elements SE through a plurality of openings 108p-2. Specifically, the conductive layer 106c may be conformably formed on the planarization layer 108b, the opening 108p-1, the opening 104p-1, the opening 108p-2 and the opening 104p-2, and the conductive layer 106c may be electrically connected to the conductive layer 106b of the circuit element CE through the opening 108p-1 and opening 104p-1, and the conductive layer 106c may be electrically connected to the conductive layer 100d of the sensing element SE through the opening 108p-2 and opening 104p-2. In addition, the conductive layer 106c may also be formed on the conductive layer 106b of the bonding structure BP and electrically connected thereto.

In accordance with some embodiments, the conductive layer 106c may include a transparent conductive material, other suitable conductive materials, or a combination thereof, but it is not limited thereto. Moreover, the method of forming the conductive layer 106c may be the same as or similar to the process of forming the conductive layer 106a or the conductive layer 106b, and thus will not be repeated here.

Figure 1E:
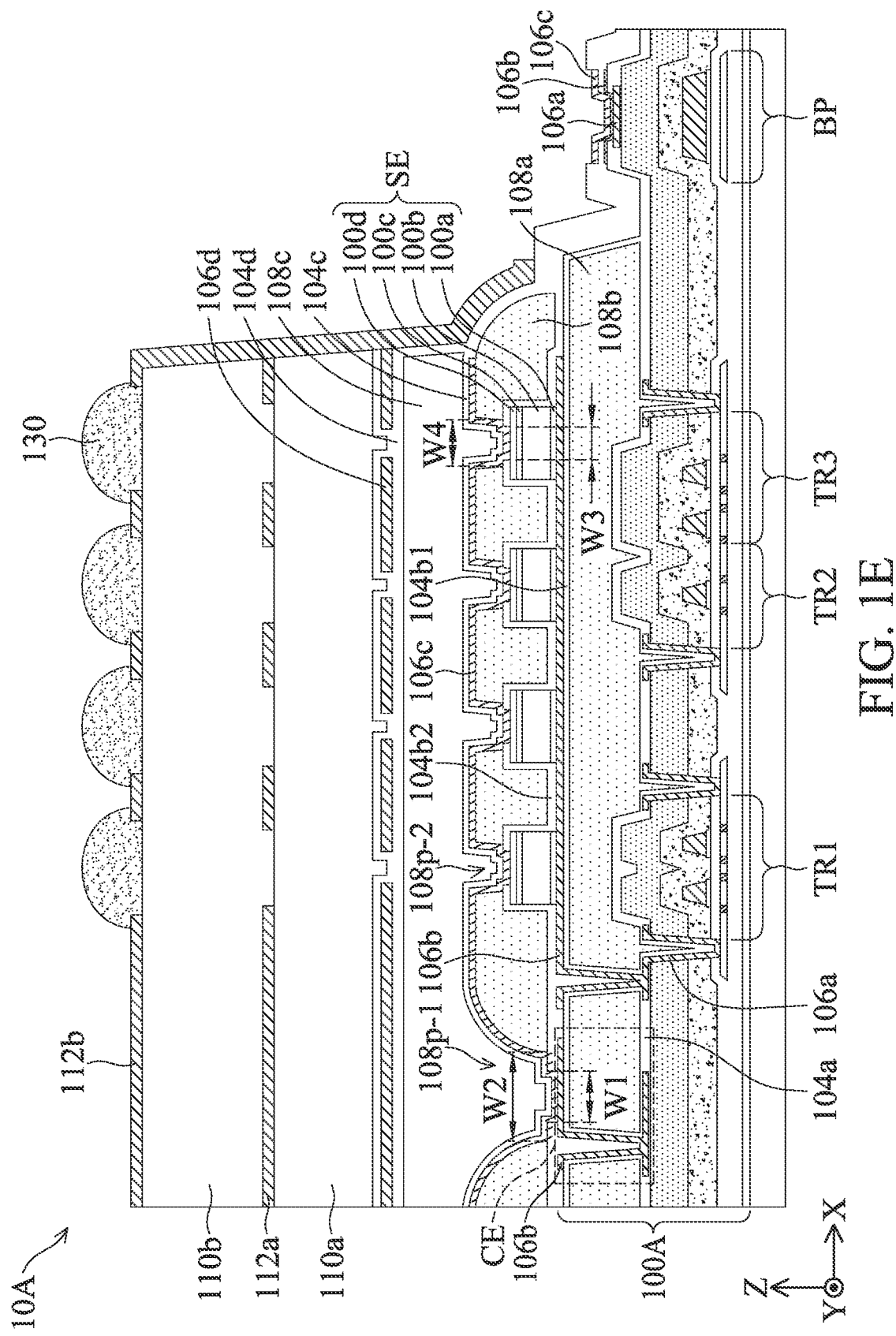

Next, referring to FIG. 1E, a passivation layer 104c may be formed on the conductive layer 106c, and a planarization layer 108c may be formed on the passivation layer 104c. Specifically, the passivation layer 104c may be conformally formed on the conductive layer 106c, and the planarization layer 108c may also be filled in the opening 108p-1, the opening 104p-1, the opening 108p-2 and the opening 104p-2. Next, a passivation layer 104d and a conductive layer 106d may be formed on the planarization layer 108c, and the conductive layer 106d may have a plurality of openings. In accordance with some embodiments, the conductive layer 106d may serve as a light-shielding layer, and the opening of the conductive layer 106d may overlap the sensing element SE in the normal direction of the substrate 102 (e.g., the Z direction in the drawing).

In accordance with some embodiments, the materials of the passivation layer 104c and the passivation layer 104d may be the same as or similar to the materials of the aforementioned passivation layer 104a or the passivation layers 104b1 and 104b2, and the methods of forming the passivation layer 104c and the passivation layer 104d may be the same as or similar to the methods of forming the aforementioned passivation layer 104a or the passivation layers 104b1 and 104b2, and thus will not be repeated here. Similarly, the material and method of forming the conductive layer 106d are also the same as or similar to those of the aforementioned conductive layer 106a or the conductive layer 106b, and thus will not be repeated here.

Next, a dielectric layer 110a, a light-shielding layer 112a, a dielectric layer 110b and a light-shielding layer 112b may be sequentially formed on the passivation layer 104d, and light-collecting elements 130 may be formed on the dielectric layer 110b, and the light-collecting elements 130 may cover portions of the light-shielding layer 112b. The light-shielding layer 112a and the light-shielding layer 112b may reduce the reflectivity of light. For example, the light-shielding layer 112a and the light-shielding layer 112b may absorb the light reflected by the conductive layer 106b or the light reflected back and forth between the conductive layers to achieve the effect of anti-reflection or reducing optical noise. The light-shielding layer 112a and the light-shielding layer 112b may also shield light with a large incidence angle, so as to achieve the effect of reducing the signal-to-noise ratio (SNR). The light-collecting element 130 may be used to collect light to the sensing element SE. As shown in FIG. 1E, the light-shielding layer 112a and the light-shielding layer 112b may also have a plurality of openings, and the openings of the light-shielding layer 112a and the light-shielding layer 112b may overlap the opening of the conductive layer 106d and the sensing element SE in the normal direction of the substrate 102 (for example, the Z direction in the figure). Moreover, in the normal direction of the substrate 102, the openings of the conductive layer 106d, the light-shielding layer 112a and the light-shielding layer 112b and the sensing element SE may all overlap with the light-collecting element 130. In accordance with some embodiments, the conductive layer 106d may be replaced by a light-shielding layer.

In accordance with some embodiments, the materials of the dielectric layer 110a and the dielectric layer 110b may include organic insulating materials or inorganic insulating materials. For example, the organic insulating material may include perfluoroalkoxy alkane (PFA), polytetrafluoroethylene (PTFE), fluorinated ethylene propylene (FEP), polyethylene, other suitable materials or a combination thereof, but it is not limited thereto. For example, the inorganic insulating material may include silicon oxide, silicon nitride, silicon oxynitride, other high-k dielectric materials, or a combination thereof, but it is not limited thereto.

In accordance with some embodiments, the dielectric layer 110a and the dielectric layer 110b may be formed by a coating process, a chemical vapor deposition process, a physical vapor deposition process, a printing process, an evaporation process, a sputtering process, other suitable processes, or a combination thereof.

In accordance with some embodiments, the light-shielding layer 112a and the light-shielding layer 112b may include organic material or metal material. The organic material may include black resin or black photosensitive material, but it is not limited thereto. The metal material may include copper, aluminum, molybdenum, indium, ruthenium, tin, gold, platinum, zinc, silver, titanium, lead, nickel, chromium, magnesium, palladium, alloys of the foregoing, other suitable metal materials, or a combination thereof, but it is not limited thereto.

In accordance with some embodiments, the light-shielding layer 112a and the light-shielding layer 112b may be formed by a chemical vapor deposition process, a physical vapor deposition process, an electroplating process, an electroless plating process, other suitable processes, or a combination thereof. In addition, the light-shielding layer 112a and the light-shielding layer 112b may be patterned by a photolithography process and/or an etching process to have openings.

In accordance with some embodiments, the light-collecting element 130 may be a micro-lens or other structures having a light collecting effect. In accordance with some embodiments, the material of the light-collecting element 130 may include silicon oxide, polymethylmethacrylate (PMMA), cycloolefin polymer (COP), polycarbonate (PC), other suitable materials or a combination thereof, but it is not limited thereto.

In addition, in accordance with some embodiments, the light-collecting element 130 may be formed by a chemical vapor deposition process, a physical vapor deposition process, a coating process, a printing process, other suitable processes, or a combination thereof. Moreover, the light-collecting element 130 may be patterned by a photolithography process and/or an etching process to have a suitable shape and profile.

As described above, the arrangement of the light-collecting element 130 may be helpful for concentrating the light in a specific area. For example, the light may be concentrated on a plurality of sensing elements SE. It should be noted that, according to the method of manufacturing the sensing device provided by the embodiments of the present disclosure, the sensing elements SE can be miniaturized, and the sensing elements SE corresponding to the light-collecting elements 130 are separated by the portion of the planarization layer 108b. Specifically, in accordance with some embodiments, the portion illuminated by the light collected by the light-collecting element 130 is provided with the sensing element SE, and the portion not illuminated by the light collected by the light-collecting element 130 is provided with the planarization layer 108b. In this way, the effect of stray capacitance on the photocurrent of the sensing element SE can be reduced, thereby improving the sensitivity of the sensing element SE or improving the overall performance of the sensing device 10A.

Figure 2:
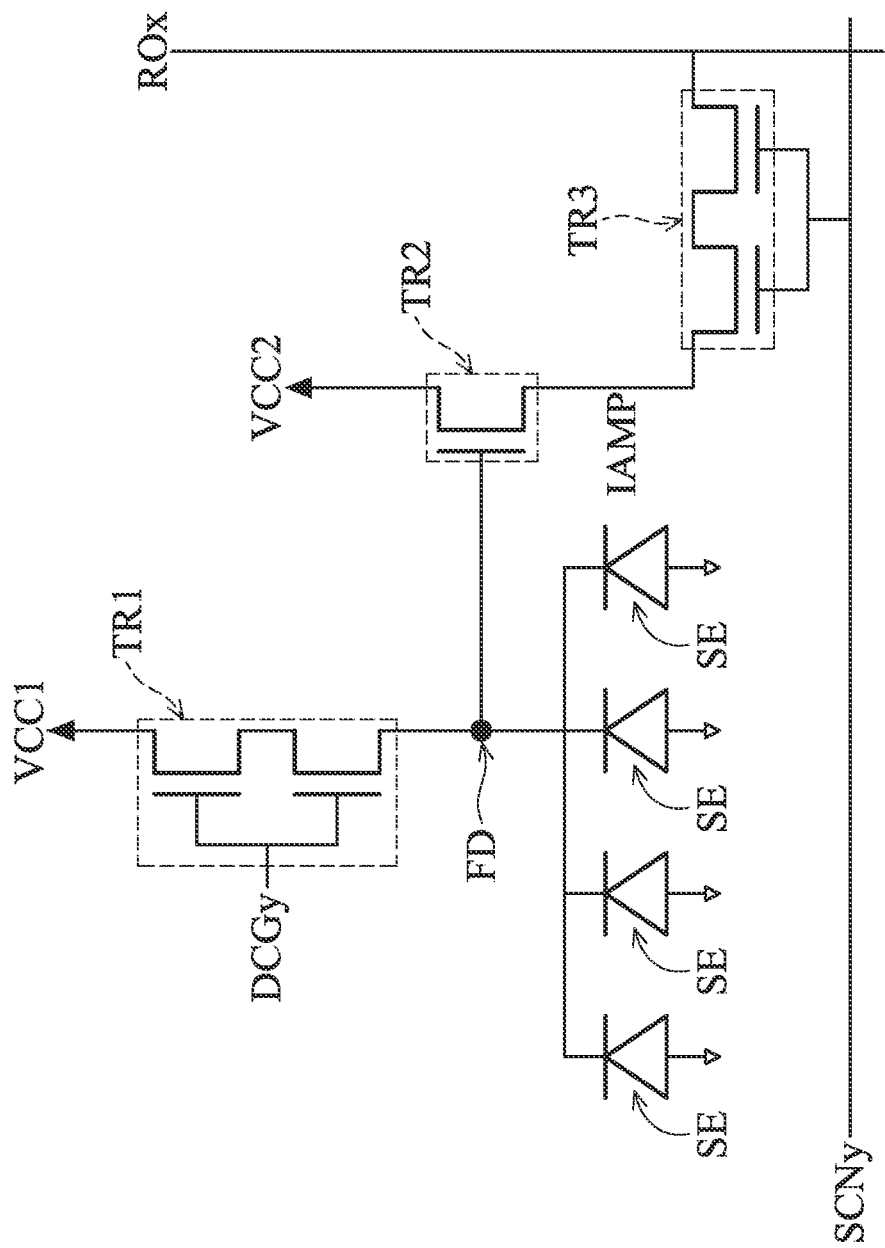
FIG. 2 is an equivalent circuit diagram of a sensing device in accordance with some embodiments of the present disclosure.

Furthermore, refer to FIG. 2, which is an equivalent circuit diagram of the sensing device 10A in accordance with some embodiments of the present disclosure. As shown in FIG. 2, a plurality of sensing elements SE may be electrically connected to a terminal FD of the sensing circuit, and the plurality of sensing elements SE may be arranged discontinuously and electrically connected to each other in parallel. In accordance with some embodiments, the terminal FD may be a floating diffusion node, the plurality of sensing elements SE may generate a plurality of sensing signals according to the collected light, and transmit these sensing signals together to the terminal FD. Specifically, the sensing signals of the plurality of sensing elements SE may be integrated into a sensing signal before being transmitted to the terminal FD. With such a circuit arrangement, the equivalent capacitance of the sensing elements SE may be reduced, and the sensitivity and performance of the sensing device may be improved.

In addition, the thin-film transistor TR1 and the thin-film transistor TR2 may be electrically connected to the terminal FD, and the thin-film transistor TR2 may be further electrically connected to the thin-film transistor TR3. In accordance with some embodiments, the thin-film transistor TR1 may reset the potential of the terminal FD to give an initial potential, and the photocurrents generated by the sensing elements SE may change the potential of the terminal FD, and the signals generated by the photocurrents may be transmitted by the thin-film transistor TR2 and the thin-film transistor TR3. Furthermore, the plurality of sensing elements SE may be coupled to a system voltage line VCC1.

Specifically, the thin-film transistor TR1 may have a first terminal, a second terminal and a control terminal. The first terminal may be coupled to the system voltage line VCC1, the second terminal may be coupled to the terminal FD, and the control terminal may be coupled to a control signal DCGy. The thin-film transistor TR1 may connect or disconnect the system voltage line VCC1 according to the control signal DCGy. When the thin-film transistor TR1 is connected to the system voltage line VCC1, the potential of the terminal FD can be reset; on the contrary, when the thin-film transistor TR1 is disconnected from the system voltage line VCC1, the potential of the terminal FD is not reset.

Furthermore, the thin-film transistor TR2 may have a first terminal, a second terminal and a control terminal. The first terminal may be coupled to a system voltage line VCC2, the second terminal may be coupled to the first terminal of the thin-film transistor TR3, and the control terminal may be coupled to the second terminal of the thin-film transistor TR1 and the terminal FD. The thin-film transistor TR2 may be used to amplify the voltage of the terminal FD to generate an amplified current IAMP.

In addition, the thin-film transistor TR3 may also have a first terminal, a second terminal and a control terminal. The first terminal may be coupled to the second terminal of the thin-film transistor TR2, the second terminal may be coupled to a readout signal line ROx, and the control terminal may be coupled to a scan line signal SCNy. The thin-film transistor TR3 may connect or disconnect the first terminal of the thin-film transistor TR3 and the readout signal line ROx according to the scan line signal SCNy. When the first terminal of the thin-film transistor TR3 is connected to the readout signal line ROx, the amplified current IAMP is output to the readout signal line ROx; on the contrary, when the first terminal of the thin-film transistor TR3 is disconnected from the readout signal line ROx, the amplified current IAMP is not output to the readout signal line ROx.

Figure 3:
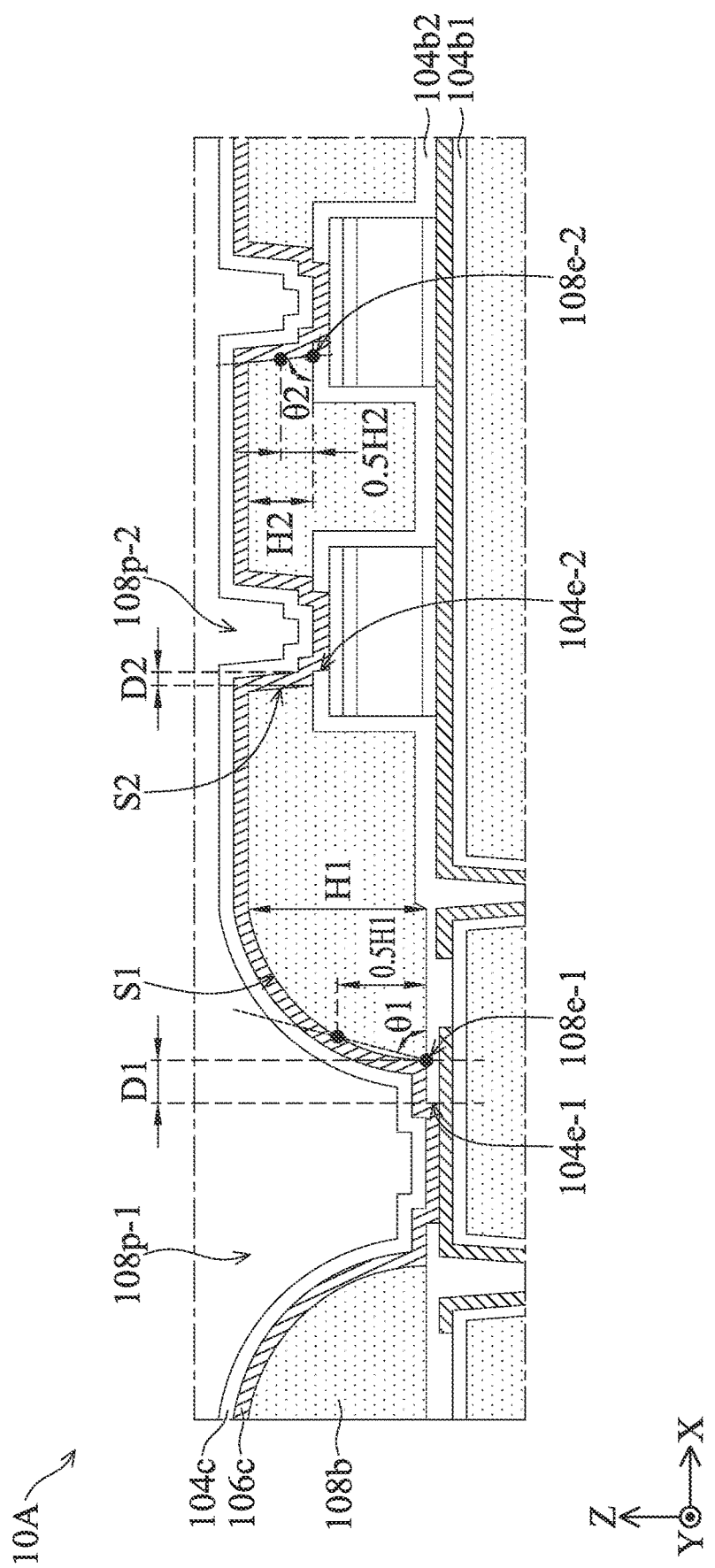
FIG. 3 is a partially enlarged cross-sectional diagram of a sensing device in accordance with some embodiments of the present disclosure.

Next, refer to FIG. 1E and FIG. 3 at the same time. FIG. 3 is a partially enlarged cross-sectional diagram of the sensing device 10A in FIG. 1E in accordance with some embodiments of the present disclosure. Specifically, FIG. 3 shows an enlarged diagram of the structures surrounding the opening 108p-1 and the opening 108p-2. As shown in FIG. 1E, the sensing device 10A formed by the above-mentioned method of manufacturing the sensing device may include the substrate 102, the circuit element CE, the sensing element SE, and the planarization layer 108b. The circuit element CE may be disposed on the substrate 102. The sensing element SE may be disposed on the substrate 102. The planarization layer 108b may be disposed on the sensing element SE and the circuit element CE, and the planarization layer 108b may include the opening 108p-1 and opening 108p-2. The opening 108p-1 may overlap the circuit element CE, and the opening 108p-2 may overlap the sensing element SE.

As shown in FIG. 3, a sidewall S1 of the opening 108p-1 may have an angle θ1 with respect to a plane of the substrate 102 (e.g., a plane that is perpendicular to the normal direction of the substrate 102, such as the X-Y plane in the drawing). A sidewall S2 of the opening 108p-2 may have an angle θ2 with respect to the plane of the substrate 102 (e.g., the X-Y plane). The angle θ1 may be smaller than the angle θ2. In other words, in accordance with some embodiments, the opening 108p-1 formed by the development process may have the sidewall S1 with a relatively flat slope, while the opening 108p-2 formed by the etching process may have the sidewall S2 with a relatively steep slope. Moreover, in accordance with some embodiments, a depth H1 of the opening 108p-1 may be greater than a depth H2 of the opening 108p-2.

Specifically, in accordance with the embodiments of the present disclosure, the sidewall S1 of the opening 108p-1 has an edge 108e-1, and the edge 108e-1 is the edge on the bottom surface of the planarization layer 108b that is closest to the opening 108p-1. In addition, the depth H1 of the opening 108p-1 can be regarded as the height of the planarization layer 108b that defines the opening 108p-1, and the height of the planarization layer 108b refers to the distance between the top and bottom surfaces of the planarization layer 108b in the normal direction of the substrate 102 (for example, the Z direction in the drawing). Moreover, the aforementioned angle θ1 refers to an included angle formed by a line connecting the position of the edge 108e-1 of the opening 108p-1 and the position of half height 0.5H1 of the sidewall S1, with respect to the plane of the substrate 102 (for example, the X-Y plane).

Similarly, in accordance with the embodiments of the present disclosure, the sidewall S2 of the opening 108p-2 has an edge 108e-2, and the edge 108e-2 is the edge on the bottom surface of the planarization layer 108b that is closest to the opening 108p-2. In addition, the depth H2 of the opening 108p-2 can be regarded as the height of the planarization layer 108b that defines the opening 108p-2, and the height of the planarization layer 108b refers to the distance between the top and bottom surfaces of the planarization layer 108b in the normal direction of the substrate 102 (for example, the Z direction in the drawing). Moreover, the aforementioned angle θ2 refers to an included angle formed by a line connecting the position of the edge 108e-2 of the opening 108p-2 and the position of half height 0.5H2 of the sidewall S2, with respect to the plane of the substrate 102 (for example, the X-Y plane).

In addition, the passivation layer 104b2 may be disposed between the circuit element CE and the planarization layer 108b, and between the sensing element SE and the planarization layer 108b. An edge 104e-1 of the passivation layer 104b2 is separated from the sidewall S1 of the opening 108p-1 by a distance D1, and an edge 104e-2 of the passivation layer 104b2 is separated from the sidewall S2 of the opening 108p-2 by a distance D2. The distance D1 may be greater than the distance D2. In other words, in accordance with some embodiments, the distance D1 by which the passivation layer 104b2 protrudes from the sidewall S1 of the planarization layer 108b toward the opening 108p-1 may be greater than the distance D2 by which the passivation layer 104b2 protrudes from the sidewall S2 of the planarization layer 108b toward the opening 108p-2.

Specifically, in accordance with the embodiments of the present disclosure, the edge 104e-1 is the edge of the passivation layer 104b2 that is closest to the opening 108p-1, and the distance D1 refers to the minimum distance between the edge 104e-1 of the passivation layer 104b2 and the sidewall S1 (e.g., the edge 108e-1) in a direction perpendicular to the normal direction of the substrate 102 (e.g., the X direction in the drawing). In addition, the distance D2 refers to the minimum distance between the edge 104e-2 of the passivation layer 104b2 and the sidewall S1 (e.g., the edge 108e-1) in a distance perpendicular to the normal direction of the substrate 102 (e.g., the X direction in the drawing). It should be understood that, since one opening has two sidewalls in a cross-sectional view, the distance D1 (distance D2) referred to in the present disclosure is based on the sidewall whose edge of the passivation layer 104b2 protrudes less from the sidewall S1 (sidewall S2) as a reference for comparison.

Next, refer to FIGS. 4A to 4E, which are cross-sectional diagrams of a sensing device 10B during different process stages in accordance with some embodiments of the present disclosure. It should be understood that, in accordance with some embodiments, additional steps may be added before, during, and/or after the method of manufacturing the sensing device 10B is performed. In accordance with some embodiments, some of the steps described below may be replaced or omitted. In accordance with some embodiments, the order of some of the steps described below may be interchangeable. Moreover, it should be understood that the same or similar components or elements in the following paragraphs will be denoted by the same or similar reference numbers, and their materials, manufacturing methods and functions are the same or similar to those described above, and thus they will not be repeated in the following paragraphs.

The method of manufacturing the sensing device 10B shown in FIGS. 4A to 4E is substantially similar to the method of manufacturing the sensing device 10A. The difference between them includes that, in the method of manufacturing the sensing device 10B, the step of patterning the passivation layer 104b2 is performed after the step of forming the planarization layer 108b, which is further described below.

Figure 4A:
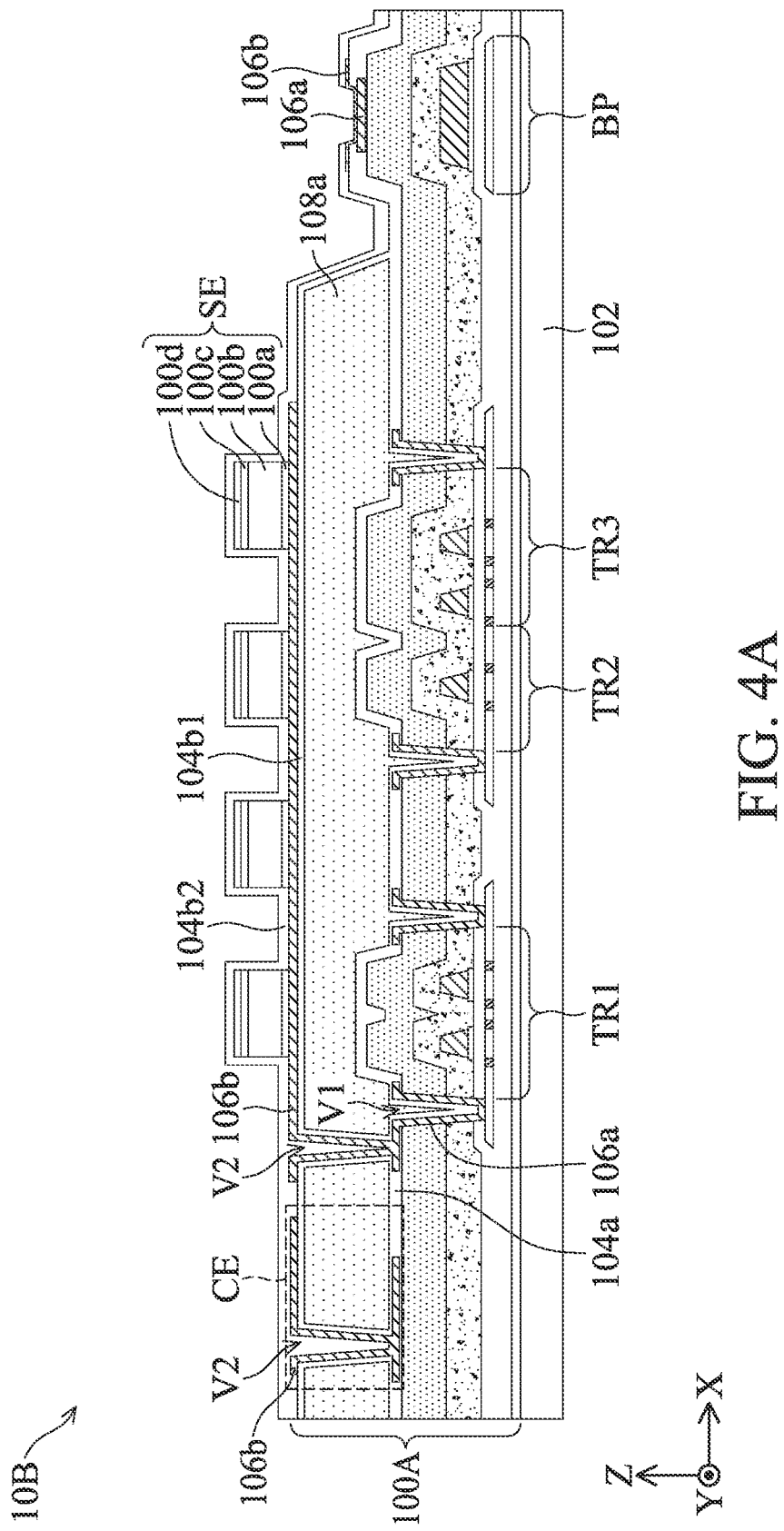
FIGS. 4A to 4E are cross-sectional diagrams of a sensing device during different process stages in accordance with some embodiments of the present disclosure.

First, referring to FIG. 4A, the substrate 102 is provided, and the circuit element CE and the sensing elements SE may be formed on the substrate 102. The sensing elements SE may be located above the planarization layer 108a and the passivation layer 104b1, and the sensing elements SE may be electrically connected to the thin-film transistor TR1, the thin-film transistor TR2, and the thin-film transistor TR3 through the conductive layer 106a in the structure layer 100A. After the sensing elements SE are formed on the planarization layer 108a, the passivation layer 104b2 may be formed on the sensing elements SE and the circuit element CE. Specifically, the passivation layer 104b2 may be conformally formed on the sensing elements SE, the conductive layer 106b and the circuit element CE.

Figure 4B:
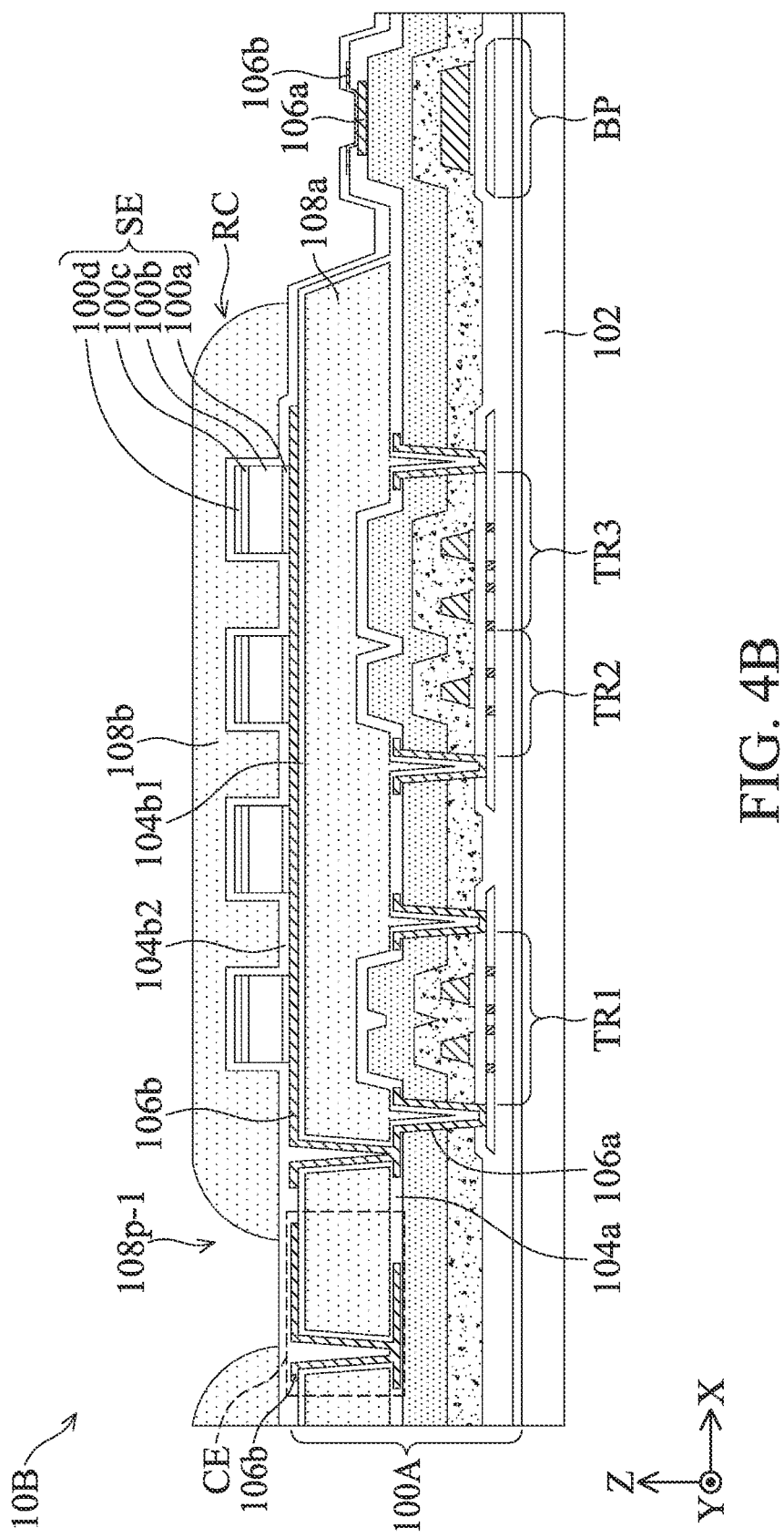

Next, referring to FIG. 4B, the planarization layer 108b may be formed on the sensing elements SE and the circuit element CE, and an opening 108p-1 may be formed in the planarization layer 108b to expose a portion of the passivation layer 104b2 above the circuit element CE. As mentioned above, in this embodiment, the step of patterning the passivation layer 104b2 is performed after the step of forming the planarization layer 108b. That is, before the planarization layer 108b is formed, the passivation layer 104b2 is not patterned to expose the circuit element CE and the sensing elements SE.

Specifically, the planarization layer 108b may first cover the sensing elements SE, the circuit element CE and the bonding structure BP, and also be filled between the sensing elements SE. Then, a portion of the planarization layer 108b located above the circuit element CE may be removed to form the opening 108p-1, and the opening 108p-1 does not expose the circuit element CE. Furthermore, as mentioned above, since the material of the planarization layer 108b itself has photosensitivity, a portion of the planarization layer 108b may be removed by the exposure and development processes in the photolithography process. That is, the opening 108p-1 may be formed by the exposure process and development process.

Figure 4C:
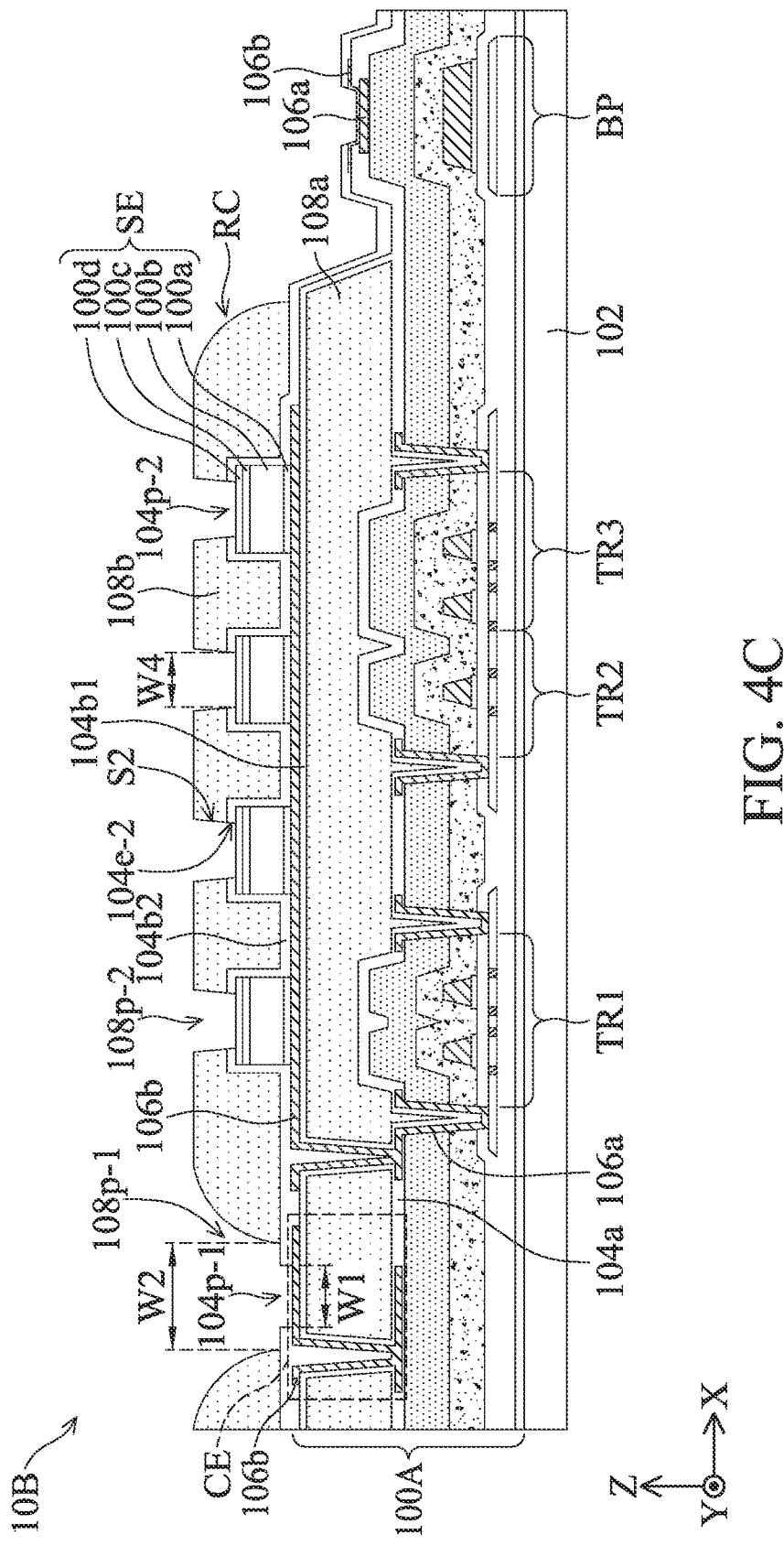

Next, referring to FIG. 4C, the opening 104p-1 may be formed in the passivation layer 104b2 to expose a portion of the circuit element CE, the opening 108p-2 may be formed in the planarization layer 108b, and the opening 104p-2 may be formed to expose the sensing element SE. Specifically, the portion of the passivation layer 104b2 located above the circuit element CE may be removed by an etching process to form the opening 104p-1, and the portion of the planarization layer 108b located above the sensing element SE may be removed by an etching process to form the opening 108p-2, and the patterned planarization layer 108b may be used as a photoresist mask in the etching process to form the opening 104p-2 in the passivation layer 104b2. The opening 104p-2 may expose a portion of the top surface of the conductive layer 100d and a portion of the side surface of the passivation layer 104b2. In this embodiment, the planarization layer 108b and the passivation layer 104b2 located above the sensing element SE may be removed by using the same mask.

As shown in FIG. 4C, the opening 104p-1 may overlap the opening 108p-1 formed in the previous step. In other words, the planarization layer 108b may have a stepped opening located above the circuit element CE. In accordance with some embodiments, the width W1 of the opening 104p-1 may be smaller than the width W2 of the opening 108p-1. Moreover, the width W2 of the opening 108p-1 may be greater than the width W4 of the opening 108p-2. In addition, in this embodiment, the edge 104e-2 of the passivation layer 104b2 may be aligned with the sidewall S2 of the opening 108p-2. That is, the distance between the edge 104e-2 of the passivation layer 104b2 and the sidewall S2 of the opening 108p-2 may be 0.

Similarly, in this embodiment, the opening 108p-1 and the opening 108p-2 are formed by different processes. The opening 108p-1 is formed by exposure and development processes, while the opening 108p-2 is formed by an etching process. Since the opening 108p-1 is formed by exposure and development processes, the thickness and flatness of the planarization layer 108b near the opening 108p-1 can be maintained, thereby reducing the generation of stray capacitance. In addition, since the opening 108p-2 is formed by an etching process, a small-sized opening can be achieved, thereby realizing the miniaturization of the sensing element SE and reducing the equivalent capacitance of the sensing element SE.

Figure 4D:
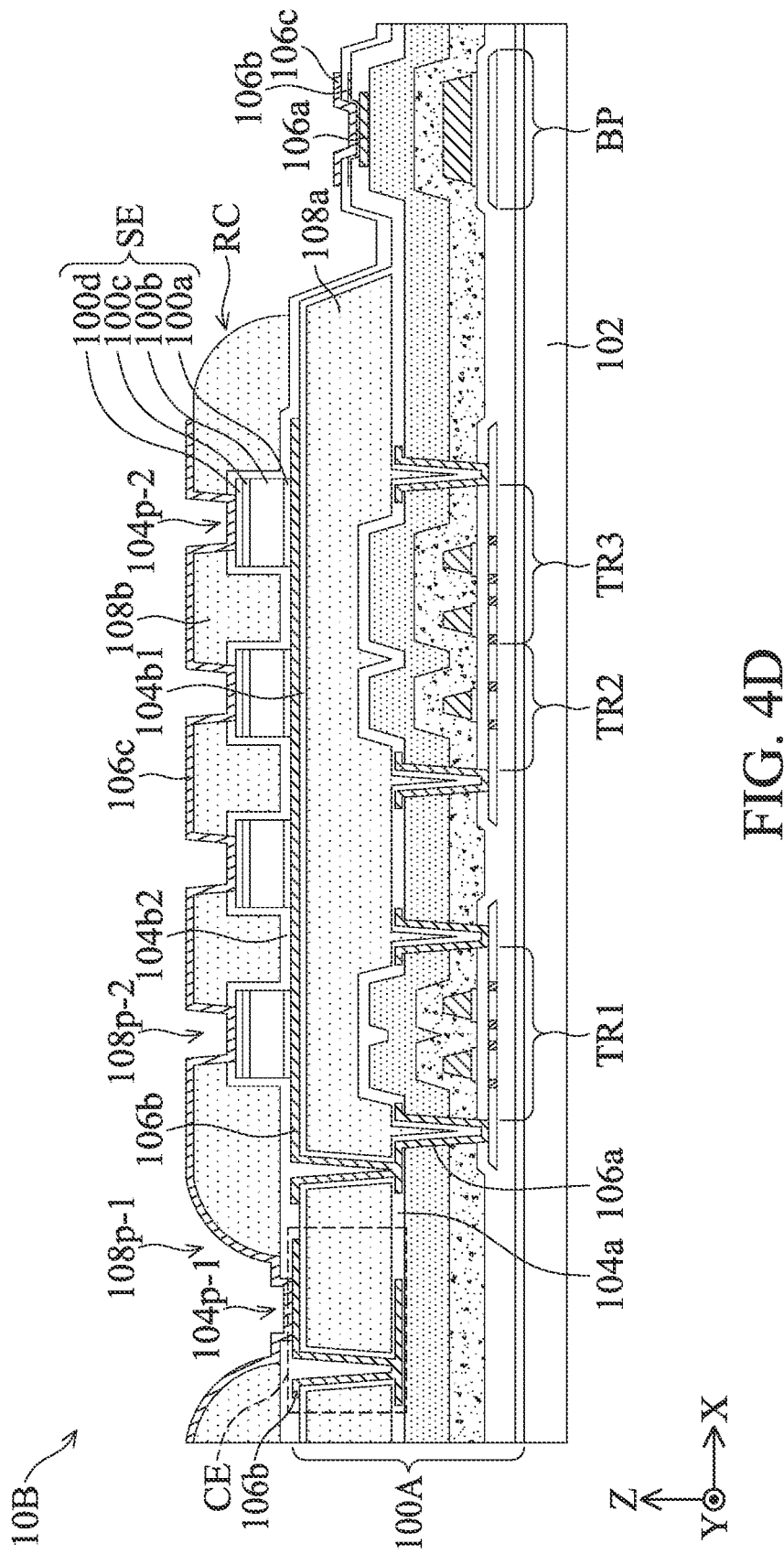

Next, referring to FIG. 4D, the conductive layer 106c may be formed on the planarization layer 108b and cover the opening 108p-1 and opening 108p-2, and the conductive layer 106c may be electrically connected to the circuit element CE and the sensing element SE through the opening 108p-1 and opening 108p-2, respectively. In accordance with some embodiments, the conductive layer 106c may be electrically connected to the sensing elements SE through a plurality of openings 108p-2. Specifically, the conductive layer 106c may be conformally formed on the planarization layer 108b, the opening 108p-1, the opening 104p-1, the opening 104p-2 and the opening 108p-2, and the conductive layer 106c may be electrically connected to the conductive layer 106b of the circuit element CE through the opening 108p-1 and the opening 104p-1, and the conductive layer 106c may be electrically connected to the conductive layer 100d of the sensing element SE through the opening 108p-2 and the opening 104p-2.

Figure 4E:
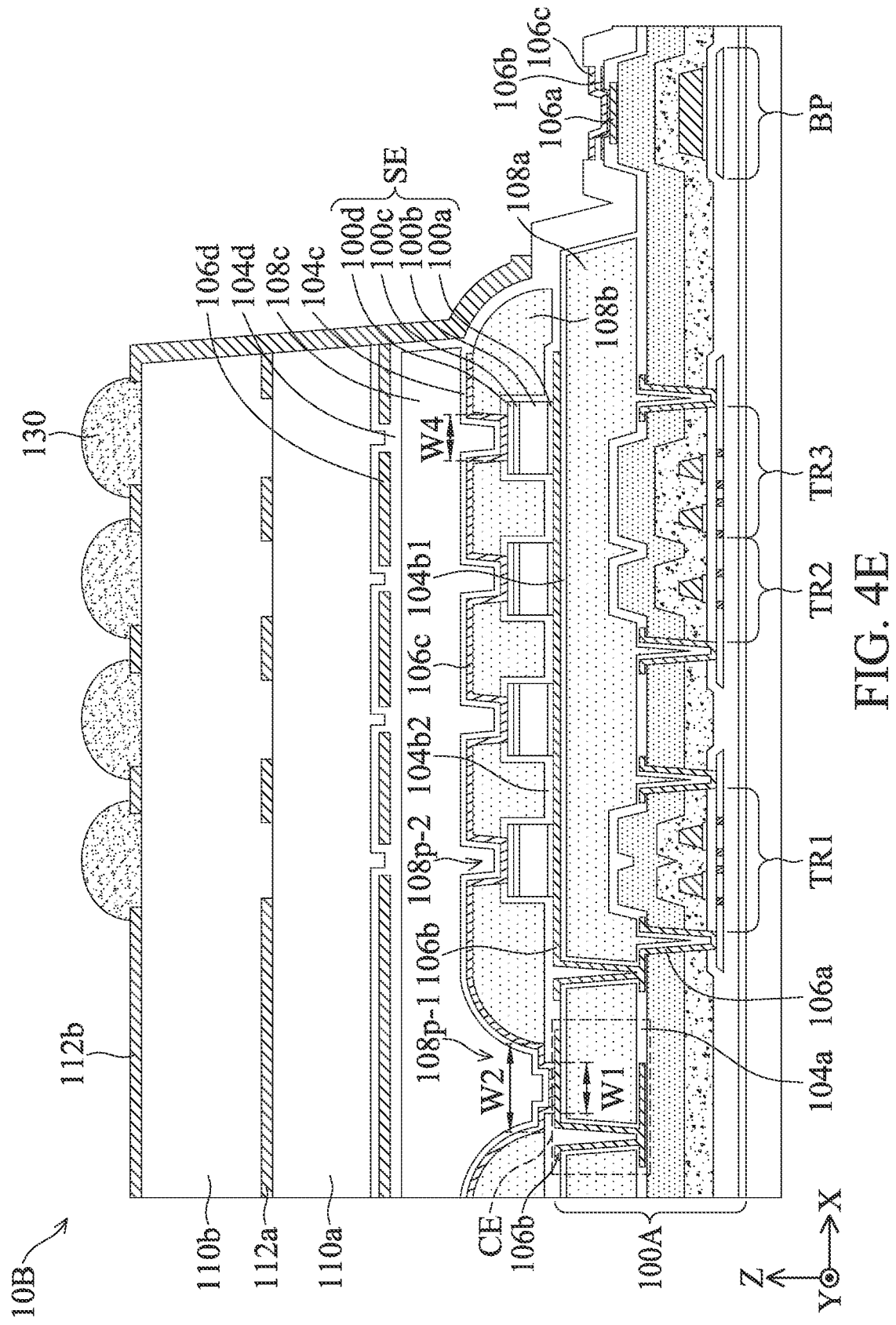

Next, referring to FIG. 4E, the passivation layer 104c may be formed on the conductive layer 106c, the planarization layer 108c may be formed on the passivation layer 104c, and the passivation layer 104d, the conductive layer 106d, the dielectric layer 110a, the light-shielding layer 112a, the dielectric layer 110b and the light-shielding layer 112b may be sequentially formed on the passivation layer 104d. In addition, the light-collecting elements 130 may be formed on the dielectric layer 110b. In accordance with some embodiments, the conductive layer 106d may be replaced by a light-shielding layer.

As shown in FIG. 4E, the sensing device 10B formed by the above-mentioned method of manufacturing the sensing device is substantially similar to the sensing device 10A shown in FIG. 1E. The difference between them includes, in the sensing device 10B, the planarization layer 108b has a stepped opening located above the circuit element CE, but the planarization layer 108b does not have a stepped opening above the sensing element SE. In addition, as described above, the edge 104e-2 of the passivation layer 104b2 in the opening 108p-2 is aligned with the sidewall S2 of the opening 108p-2 (as shown in FIG. 4C).

Figure 5:
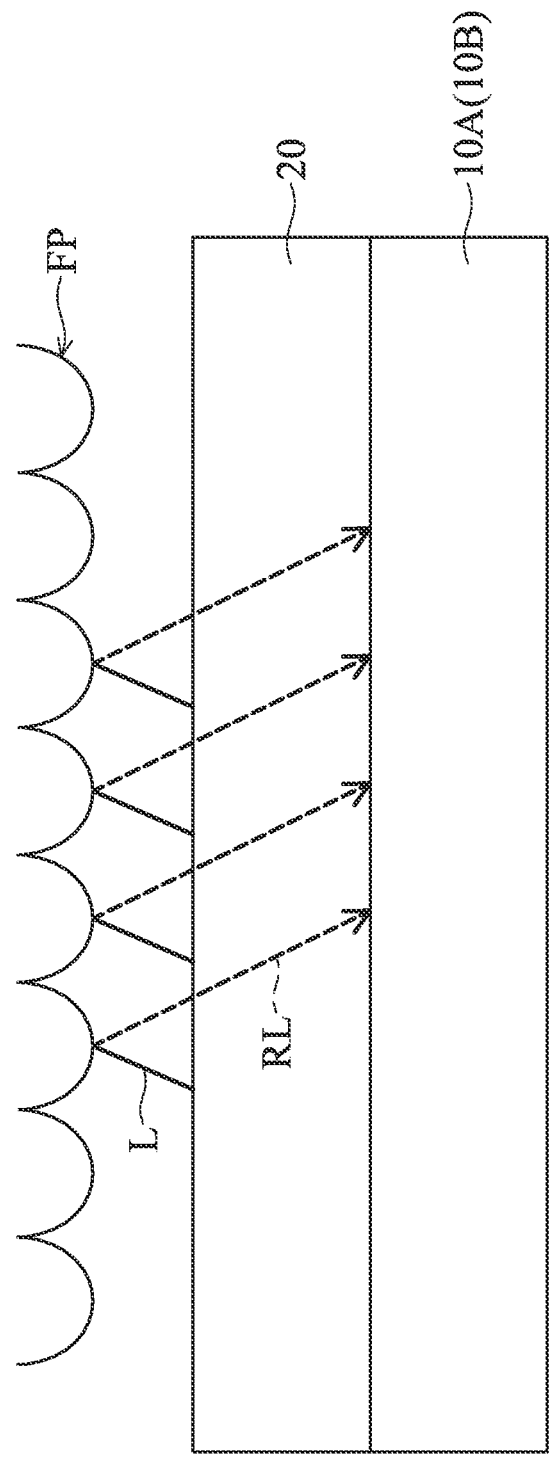
FIG. 5 is a diagram of an electronic device in accordance with some embodiments of the present disclosure.

Refer to FIG. 5, which is a diagram of an electronic device 1 in accordance with some embodiments of the present disclosure. It should be understood that, for clear description, the elements of the electronic device 1 are only schematically illustrated in the drawing. In accordance with some embodiments, additional features may be added to the electronic device 1 described below.

The electronic device 1 may include the aforementioned sensing device 10A (or the sensing device 10B) and a display device 20, and the sensing device 10A may be disposed below the display device 20. In accordance with some embodiments, the electronic device 1 may have functions such as touch-sensing or fingerprint recognition. For example, the electronic device 1 may be a touch display device, but it is not limited thereto. For example, the light L generated by the display device 20 may be reflected by a finger FP to generate the reflected light RL, and the reflected light RL may be transmitted to the sensing device 10A. The sensing device 10A can sense the touch of the finger, and convert it into an electronic signal to the corresponding driving component or signal processing component for identification and analysis. In accordance with some embodiments, the display device 20 may be fixed on the sensing device 10A by an adhesive layer (not illustrated). In accordance with some embodiments, the adhesive layer may include a light-curable adhesive material, a heat-curable adhesive material, a light-heat-curable adhesive material, another suitable material, or a combination thereof, but it is not limited thereto. For example, in accordance with some embodiments, the adhesive layer may include, but is not limited to, optical clear adhesive (OCA), optical clear resin (OCR), pressure sensitive adhesive (PSA), another suitable material, or a combination thereof.

In accordance with some embodiments, the display device 20 may include, for example, a liquid-crystal display panel, a light-emitting diode display panel, such as an inorganic light-emitting diode display panel, an organic light-emitting diode (OLED) display panel, a mini light-emitting diode (mini LED) display panel, a micro light-emitting diode (micro LED) display panel, or a quantum dot (QD) light-emitting diode (e.g., QLED or QDLED) display panel, but it is not limited thereto.

To summarize the above, according to the embodiments of the present disclosure, the provided method of manufacturing the sensing device includes using different patterning processes to form openings at specific positions of the planarization layer, which can comprehensively improve the flatness, thickness, and resolution of the openings of the planarization layer. Therefore, the size of the sensing element can be miniaturized and the generation of stray capacitance can be reduced. Accordingly, the equivalent capacitance of the sensing element can be reduced, the sensitivity of the sensing element can be improved or the overall performance of the sensing device can be improved.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A method of manufacturing a sensing device, comprising:
    providing a substrate;
    forming a circuit element on the substrate;
    forming a sensing element on the substrate;
    forming a planarization layer on the sensing element and the circuit element;
    forming a first opening in the planarization layer, wherein the first opening overlaps with the circuit element and a sidewall of the first opening comprises a first included angle formed by a line connecting the position of an edge of the first opening and the position of half height of the sidewall with respect to a plane of the substrate;
    forming a second opening in the planarization layer, wherein the second opening overlaps with the sensing element and a sidewall of the second opening comprises a second included angle formed by a line connecting the position of an edge of the second opening and the position of half height of the sidewall with respect to the plane of the substrate; and
    forming a conductive layer on the planarization layer;
    wherein the first opening and the second opening are formed by different processes and the first included angle is smaller than the second included angle; and
    wherein the circuit element is electrically connected to the sensing element through the conductive layer.

2. The method of manufacturing a sensing device as claimed in claim 1, wherein the first opening is formed by an exposure process and a developing process, and the second opening is formed by an etching process.

3. The method of manufacturing a sensing device as claimed in claim 1,
    wherein the conductive layer covers the first opening and the second opening, wherein the conductive layer is electrically connected to the circuit element and the sensing element through the first opening and the second opening, respectively.

4. The method of manufacturing a sensing device as claimed in claim 1, further comprising:
    before the step of forming the planarization layer, forming a passivation layer on the sensing element and the circuit element; and
    patterning the passivation layer to expose the circuit element and the sensing element.

5. The method of manufacturing a sensing device as claimed in claim 4, wherein the step of patterning the passivation layer is performed before the step of forming the planarization layer.

6. The method of manufacturing a sensing device as claimed in claim 4, wherein the step of patterning the passivation layer is performed after the step of forming the planarization layer.

7. The method of manufacturing a sensing device as claimed in claim 4, further comprising:
    forming a light-shielding layer on the passivation layer; and
    forming a light-collecting element on the light-shielding layer,
    wherein the light-collecting element covers a portion of the light-shielding layer.

8. The method of manufacturing a sensing device as claimed in claim 7, wherein the light-shielding layer comprises an opening, and the light-collecting element overlaps with the opening of the light-shielding layer and the sensing element.

9. A sensing device, comprising:
    a substrate;
    a circuit element disposed on the substrate;
    a sensing element disposed on the substrate;
    a planarization layer disposed on the sensing element and the circuit element, wherein the planarization layer comprises a first opening and a second opening, the first opening overlaps with the circuit element, and the second opening overlaps with the sensing element; and
    a conductive layer disposed on the planarization layer,
    wherein a sidewall of the first opening comprises first included angle formed by a line connecting the position of an edge of the first opening and the position of half height of the sidewall with respect to a plane of the substrate,
    wherein a sidewall of the second opening comprises a second included angle formed by a line connecting the position of an edge of the second opening and the position of half height of the sidewall with respect to the plane of the substrate, and the first included angle is smaller than the second included angle, and
    wherein the circuit element is electrically connected to the sensing element through the conductive layer.

10. The sensing device as claimed in claim 9, wherein a depth of the first opening is greater than a depth of the second opening.

11. The sensing device as claimed in claim 9, wherein a width of the first opening is greater than a width of the second opening.

12. The sensing device as claimed in claim 9, wherein the circuit element is used to provide a common voltage signal.

13. The sensing device as claimed in claim 9,
    wherein the conductive layer is electrically connected to the circuit element and the sensing element through the first opening and the second opening, respectively.

14. The sensing device as claimed in claim 9, further comprising:
    a passivation layer disposed between the circuit element and the planarization layer, and between the sensing element and the planarization layer.

15. The sensing device as claimed in claim 14, wherein an edge of the passivation layer is separated from the sidewall of the first opening by a first distance, and an edge of the passivation layer is separated from the sidewall of the second opening by a second distance, and the first distance is greater than the second distance.

16. The sensing device as claimed in claim 14, wherein an edge of the passivation layer is aligned with the sidewall of the second opening.

17. The sensing device as claimed in claim 14, further comprising:
    a light-shielding layer disposed on the passivation layer; and
    a light-collecting element disposed on the light-shielding layer,
    wherein the light-collecting element covers a portion of the light-shielding layer.

18. The sensing device as claimed in claim 17, wherein the light-shielding layer comprises an opening, and the light-collecting element overlaps with the opening of the light-shielding layer and the sensing element.

19. An electronic device, comprising:
    a display device; and
    a sensing device disposed below the display device, wherein the sensing device comprises:
    a substrate;
    a circuit element disposed on the substrate;
    a sensing element disposed on the substrate;
    a planarization layer disposed on the sensing element and the circuit element, wherein the planarization layer comprises a first opening and a second opening, the first opening overlaps with the circuit element, and the second opening overlaps with the sensing element; and
    a conductive layer disposed on the planarization layer,
    wherein a sidewall of the first opening comprises first included angle formed by a line connecting the position of an edge of the first opening and the position of half height of the sidewall with respect to a plane of the substrate,
    wherein a sidewall of the second opening comprises a second included angle formed by a line connecting the position of an edge of the second opening and the position of half height of the sidewall, with respect to the plane of the substrate, and the first included angle is smaller than the second included angle, and
    wherein the circuit element is electrically connected to the sensing element through the conductive layer.

* * * * *